US010826482B1

(12) United States Patent
Kwok et al.

(10) Patent No.: US 10,826,482 B1
(45) Date of Patent: Nov. 3, 2020

(54) GATE VOLTAGE CONTROL

(71) Applicant: NXP B.V., Eindhoven (NL)

(72) Inventors: Kenneth Chung Yin Kwok, Irvine, CA (US); Suming Lai, San Diego, CA (US); Xuechu Li, Shanghai (CN); Fuchun Zhan, Shanghai (CN); Jian Qing, Shanghai (CN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/851,054

(22) Filed: Apr. 16, 2020

(30) Foreign Application Priority Data

Feb. 18, 2020 (CN) .......................... 2020 1 0100661

(51) Int. Cl.
*H03K 17/00* (2006.01)
*H03K 17/082* (2006.01)
*H01L 29/788* (2006.01)

(52) U.S. Cl.
CPC ....... *H03K 17/0822* (2013.01); *H01L 29/788* (2013.01)

(58) Field of Classification Search
CPC ............. H03K 17/082; H03K 17/0822; H03K 17/0814; H03K 17/08142
See application file for complete search history.

(56) References Cited

U.S. PATENT DOCUMENTS 7,061,217 B2 *  6/2006  Bayer ............. H03K 17/08122
                                                      323/284
9,722,593 B2    8/2017  Berkhout et al.

* cited by examiner

*Primary Examiner* — An T Luu
(74) *Attorney, Agent, or Firm* — Rajeev Madnawat

(57) ABSTRACT

Aspects of the present disclosure are directed to circuitry to control a gate voltage. As may be implemented in accordance with one or more embodiments, a voltage level is controlled for a field effect transistor (FET) having a floating gate and a target operating voltage above which the FET would be overcharged and around which the FET has a nominal operating range. Pulse circuitry is configured to apply energy to the floating gate in pulses, in operation the applied energy being pulsed low relative to the gate's target operating voltage, and then being changed by adjusting successive pulses until the gate reaches the target operating voltage. A feedback circuit samples a voltage level of, and enables the pulse circuitry to apply pulsed energy to, the floating gate for directing operation of the FET based on the target operating voltage in the nominal operating range.

20 Claims, 4 Drawing Sheets

GATE VOLTAGE CONTROL

OVERVIEW

Aspects of various embodiments are directed to voltage control, as may be implemented for controlling gate voltage.

Voltage control for a variety of applications can be challenging. For instance, the gate voltage swing of transistors, such as a power MOSFET in a switched-capacitor converter (SCC), may be determined by a power supply voltage to a gate driver. This voltage may be derived from a supply input pin or an external bootstrap capacitor. Controlling the voltage in such applications can be challenging, and may require the use of additional circuitry and/or what may be inefficient control functions. For instance, such a bootstrap voltage supply may increase required circuit board area and related cost, and result in EMI emissions and higher noise level. For switching applications, peak currents through the power MOSFET may be high during switching, which may cause excessive supply ringing due to parasitic supply inductance and subsequently lead to electrical overstress (EOS) damage. Extremely high localized power dissipation due to the condition of maximum gate-to-source voltage (Vgs) and drain-to-source voltage (Vds) concurrently occurring during SCC start-up can stress the power MOSFET as well as other circuits integrated with the power MOSFET.

These and other matters have presented challenges to efficiencies of voltage control for a variety of applications.

SUMMARY

Various example embodiments are directed to issues such as those addressed above and/or others which may become apparent from the following disclosure concerning the control of a voltage level of a transistor gate. In certain example embodiments, aspects of the present disclosure involve applying pulses to a floating gate, by adjusting successive ones of the pulses based upon feedback indicative of the voltage level of the floating gate. In various such contexts, the pulses can be adjusted in gate charging current and/or gate charging duration to charge the floating gate to a desirable target level.

In accordance with a more specific embodiment, an apparatus includes a field effect transistor (FET), pulse circuitry and a feedback circuit. The FET has a floating gate and a target operating voltage above which the FET would be overcharged and around which the FET has a nominal operating range. The pulse circuitry applies energy to the floating gate in pulses, in operation the applied energy being pulsed low relative to the gate's target operating voltage, and then being changed by adjusting successive pulses until the gate reaches the target operating voltage. The feedback circuit samples a voltage level of, and enables the pulse circuitry to apply pulsed energy to, the floating gate to control the FET via the floating gate for directing operation of the FET based on the target operating voltage in the nominal operating range.

In another more specific embodiment, an apparatus includes a transistor having a gate with a target operating voltage, a feedback circuit configured and arranged to sample a voltage level of the gate, and a gate driver circuit. The gate driver circuit is configured and arranged with the feedback circuit to charge the gate to the target operating voltage by applying an energy pulse to the gate, the energy pulse charging the gate to a voltage level that is less than the target operating voltage of the gate. In response to a voltage level of the gate sampled by the feedback circuit, the gate driver circuit applies an adjusted energy pulse to the transistor gate, the adjusted energy pulse having a value that is based on the sampled voltage level and the target operating voltage of the gate.

Various functions as characterized herein may be carried out in method-based embodiments. A particular embodiment is directed to method as follows. Energy is applied in pulses to a floating gate of a field effect transistor (FET) having a target operating voltage above which the FET would be overcharged and around which the FET has a nominal operating range, by pulsing the applied energy pulsed low relative to the gate's target operating voltage. A voltage level of the floating gate is sampled, and the energy applied to the floating gate is adjusted in successive ones of the pulses until the gate reaches the target operating voltage.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
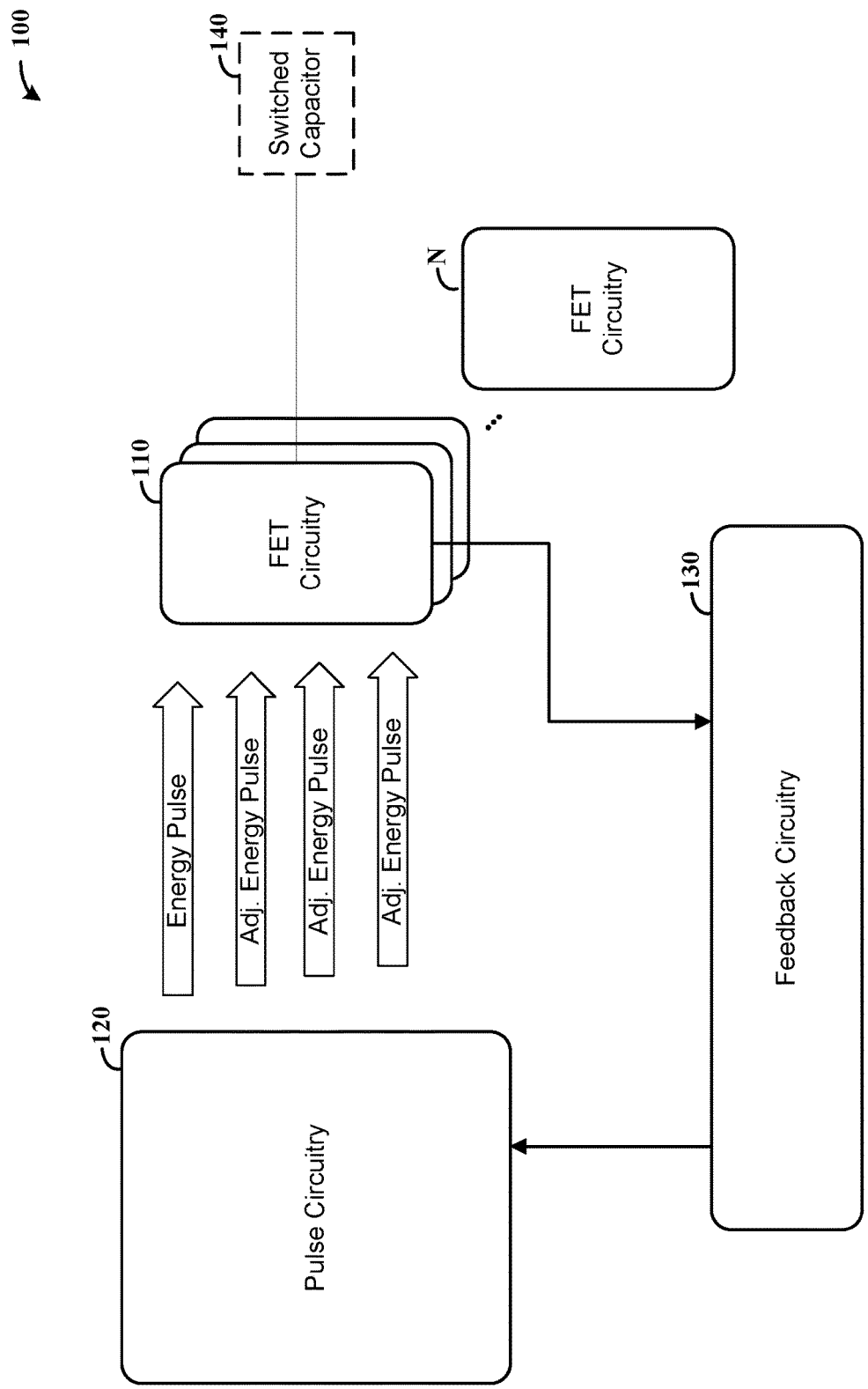
FIG. 1 shows an apparatus as may be implemented in accordance with one or more aspects of the disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving voltage control, such as for accurately controlling the gate voltage of a transistor. In certain implementations, aspects of the present disclosure have been shown to be beneficial when used in the context of controlling gate voltage in a power MOSFET, and in such applications involving high frequency switching. In some embodiments, the gate voltage swing is controlled in a power MOSFET utilized in a high switching frequency SCC. Such approaches may be implemented with various switched-capacitor based power converters using multiple power MOSFETs to delivery charge using switched flying capacitors. While not necessarily so limited, various aspects may be appreciated through the following discussion of non-limiting examples which use exemplary contexts.

Various aspects of the present disclosure are directed to methods and/or apparatuses for addressing challenges such as those noted herein, for accurately setting gate voltage swing to a particular level. This approach may be implemented for one or more of controlling start-up inrush current, optimizing efficiency, or limiting gate voltage to a level that suits a particular application (e.g., recommended by process technology). This may further be achieved independent of the gate driver supply voltage, and may eliminate the need to deploy an external bootstrap capacitor to set the gate voltage swing. In some embodiments, these methods and/or apparatuses may be utilized in a high-voltage SCC implemented with multiple stacked power MOSFET switches, to provide an appropriate gate driver supply voltage to drive the gate of the power MOSFET, which may otherwise not be available via Vgs voltages of the process technology in which the high-voltage SCC is utilized.

In the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

A closed-loop Vgs control scheme is utilized in connection with various embodiments, which may address challenges including those noted above. The gate voltage swing of the power MOSFET is accurately controlled by utilizing a closed-loop approach to servo the on-time of the gate driver. The on-time and the gate charging current controls the amount of charge dumped to the gate of the power MOSFET, which consequently yields a particular Vgs voltage determined by the effective gate capacitance of the power MOSFET. This Vgs may be characterized as:

$$Vgs = (Ichg \times Ton)/Cgg(\mathit{eff}),$$

where Ichg is the gate charging current, Ton is the on-time, and Cgg(eff) is the effective gate capacitance. After the on-time period, the gate driver may set the gate of power MOSFET to high-impedance, allowing the gate voltage to be maintained on the power MOSFET.

The Vgs voltage may be sampled at the end of the switch-on transition (e.g., after Vgs voltage has stabilized) and fed to a servo loop (as may also be referred to as a feedback loop) that controls the on-time to achieve the desired target Vgs voltage. Alternatively, the on-time can be a fixed entity and the servo loop can be used to control the gate charging current to achieve the same end goal of controlling the Vgs voltage swing. This technique allows the power MOSFET gate voltage swing to be accurately controlled to a target level, and may facilitate optimal gate voltage for efficiency in normal operating mode and power MOSFET current limiting in soft-start mode. In certain implementations, the gate voltage swing of the power MOSFET can be made independent of the gate driver supply voltage as long as it is higher than the target gate voltage, allowing any convenient supply to be used to power the gate drivers, which may eliminate the need for external bootstrap capacitors.

In certain implementations, the Vgs voltage swing target is set based on gate-driver on-time control. The on-time starts from a minimum when the driver is enabled. The Vgs difference voltage from the target is continuously monitored and corrected by a negative feedback loop. Using this approach, highly accurate gate voltage swing control is achievable at multi-MHz switching frequency. Further, the gate of the power MOSFET may be completely floated during switching operation. A secondary gate clamp may be used to limit Vgs voltage in the event the servo loop does not respond fast enough to dynamic gate voltage change, such as may be due to capacitive coupling.

In accordance with a more specific embodiment, an apparatus includes a field effect transistor (FET) having a floating gate with a target operating voltage, pulse circuitry, and a feedback circuit that samples a voltage level of the floating gate. The pulse circuitry applies energy to the floating gate in pulses, which may involve pulsing the energy low relative to the gate's target operating voltage and subsequently adjusting successive pulses based on the sampled voltage level until the gate reaches the target operating voltage. The feedback circuit thus enables the pulse circuitry to apply pulsed energy to control the FET via the floating gate based on the target operating voltage in the nominal operating range. The feedback circuit may sample the voltage level at the end of a switch-on transition of the floating gate, and after the gate-source voltage of the floating gate has stabilized. In certain implementations, the FET is a power MOSFET and the apparatus includes a plurality of the power MOSFETs, pulse circuitry and feedback circuits operating as such, with a switched-capacitor converter coupled to the plurality of power MOSFETs.

The pulse circuitry operates with the feedback circuit to adjust the successive pulses in a variety of manners. In some implementations, the duration of an applied energy pulse is adjusted relative to a duration of a preceding energy pulse. In other implementations, a current level of an applied energy pulse is adjusted relative to the current level of a preceding energy pulse. In yet other implementations, both pulse duration and current level of a pulse are adjusted relative to the duration and current level of a preceding energy pulse.

In certain embodiments, the pulse circuitry and feedback circuit are configured to apply a plurality of energy pulses to the floating gate on a repetitive basis, with the feedback circuit sampling a voltage level of the floating gate after each of the plurality of energy pulses is applied. Each successive one of the energy pulses is adjusted relative to a preceding energy pulse (e.g., as may encompass two or more such energy pulses) based on the sampled voltage level of the floating gate, after application of the preceding energy pulse.

In a particular embodiment, overcharging of the floating gate is addressed as follows. The pulse circuitry applies an initial energy pulse to the floating gate followed by iterative energy pulses each having an energy level that is higher than the preceding energy pulse, until the floating gate reaches the target operating voltage. In response to the sampled voltage level of the floating gate exceeding the target operating voltage, a succeeding energy pulse that is applied has an energy level that is lower than the energy level of the preceding pulse.

In certain embodiments, the pulse circuitry floats the floating gate during a switching operation of the FET. The apparatus may further include a gate clamp configured to limit a gate-source of the floating gate, which can be facilitated while the floating gate is floated (e.g., to mitigate capacitive charging).

The pulse circuitry may include a gate driver that applies the pulses to the floating gate, in which the voltage of the floating gate is maintained by setting an impedance of the gate driver to high-impedance. The pulse circuitry may set this high impedance after applying energy to the floating gate in pulses, to maintain the voltage.

In another more specific embodiment, an apparatus includes a transistor, a feedback circuit configured and arranged to sample a voltage level of the gate, and a gate driver circuit. The gate driver circuit is configured with the feedback circuit to charge the gate to a target operating voltage by applying an initial energy pulse to the gate that is less than the target operating voltage of the gate. In response to a voltage level of the gate sampled by the feedback circuit, the gate driver circuit applies an adjusted energy pulse to the transistor gate having a value that is based on the sampled voltage level and the target operating voltage of the gate. This adjusted energy pulse (or several such adjusted energy pulses) may be adjusted via one or both of a duration of the pulse (e.g., gate charging current pulse) relative to a duration of a preceding pulse applied to the gate, and a current level of the pulse, relative to the current level of a preceding pulse applied to the gate.

In some embodiments, the gate driver circuit is configured with the feedback circuit to apply a plurality of energy pulses to the gate on a repetitive basis, with the feedback circuit sampling a voltage level of the gate after each of the plurality of energy pulses is applied. The gate driver circuit adjusts each successive one of the plurality of pulses relative to one or more preceding pulses based on the sampled voltage level of the gate after application of the preceding pulse(s) to the gate.

A method-based embodiment may be carried out as follows. Energy pulses are applied to a floating gate of a field effect transistor (FET), a voltage level of the floating gate is sampled, and the energy applied to the floating gate is adjusted in successive ones of the pulses based on the sampled voltage level after each pulse until the gate reaches the target operating voltage. Accordingly, the pulses may be applied to operate the FET at a target operating voltage above which the FET would be overcharged and around which the FET has a nominal operating range. Consistent with one or more embodiments, pulse circuitry may be used to apply the energy pulses to the floating gate, with the feedback enabling the pulse circuitry to control the FET via the floating gate based on the target operating voltage in the nominal operating range. Accordingly, the voltage level of the floating gate may be sampled after each of the energy pulses is applied to the floating gate, with the energy applied to the floating gate in each of the successive ones of the pulses being adjusted based on the sampled voltage level of the floating gate after application of the preceding energy pulse.

The energy applied to the floating gate is adjusted for successive pulses in a variety of manners. In some implementations, the duration of an applied gate charging current pulse is adjusted relative to a duration of a preceding gate charging pulse. In other implementations, a current level of an applied gate charging current pulse is adjusted relative to the current level of a preceding gate charging current pulse. In yet other implementations, both pulse duration and current level of a pulse are adjusted relative to the duration and current level of a preceding pulse.

Turning now to the figures, FIG. 1 shows an apparatus 100, as may be implemented in accordance with one or more embodiments. The apparatus 100 includes FET circuitry 110, pulse circuitry 120, and feedback circuitry 130, which may operate with a switched capacitor 140. The FET circuitry 110 may include a plurality of respective FETs, as represented by FETs 110-N, to suit particular applications. The pulse circuitry 120 is configured to apply respective energy pulses (also referred to as gate charging current pulses) for controlling operation of the FET circuitry 110, to charge a floating gate therein. Accordingly, successive pulses may be applied to maintain the floating gate at a target operating level, such as by ramping the floating gate up to the target operating level and maintaining the floating gate thereat via the application of successive adjusted pulses. In this context, the energy applied by each energy pulse may be controlled via pulse duration and/or current level, and be varied to increase or decrease the applied energy relative to previous pulses.

The energy pulses may, for example, be implemented with a first energy pulse followed by several adjusted energy pulses as shown in FIG. 1. The energy level in each adjusted energy pulse is set based on feedback provided by the feedback circuitry 130, which may monitor the voltage level of the FET circuitry 110 (e.g., after application of a previous pulse and after the corresponding gate voltage has adjusted to the pulse). The FET circuitry 110 may further include a voltage clamp that clams the gate-source voltage of the floating gate therein.

Figure 2:
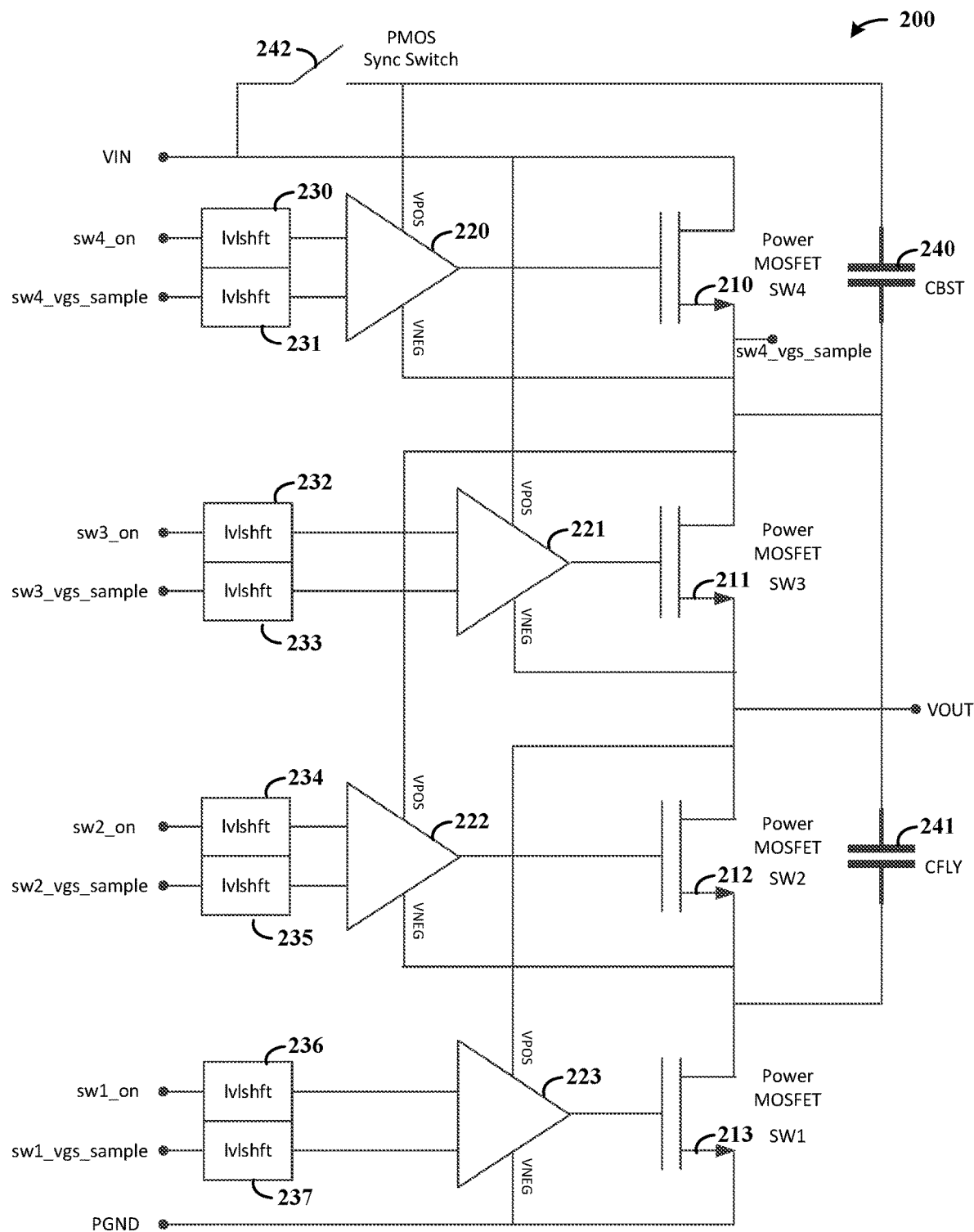
FIG. 2 shows an apparatus as may be implemented in accordance with one or more aspects of the disclosure.

FIG. 2 shows an apparatus 200, as may be implemented with various embodiments. The apparatus 200 includes respective power MOSFETs 210-213, each having a floating gate and respective gate driver circuits 220-223 coupled to apply energy pulses to the floating gates. The gate driver circuits are fed by level shifters 230-237 as shown. Referring to gate driver circuit 220 by way of example, the level shifters 230 and 231 operate as part of a feedback/servo loop involving a gate-source voltage sampling as depicted with power MOSFET 210. Switched capacitor circuitry includes capacitors 240 and 241 coupled as shown with switches 210-213 and 242.

Each gate driver circuit may be powered by a nominal power supply of about VIN/2, which may be equal to VOUT and $V_{CFLY}$ in a 2:1 conversion with:

SW1 (213): VOUT
SW2 (212): $V_{CFLY}$
SW3 (211): (VIN−VOUT)
SW4 (210): $V_{CBST}$

A closed-loop voltage limiting scheme may be used to limit the gate-source voltage "Vgs" for each power MOSFET to a programmable level, or a programmable current-mirror bias voltage to limit switching current during an initial soft-start.

Figure 3:
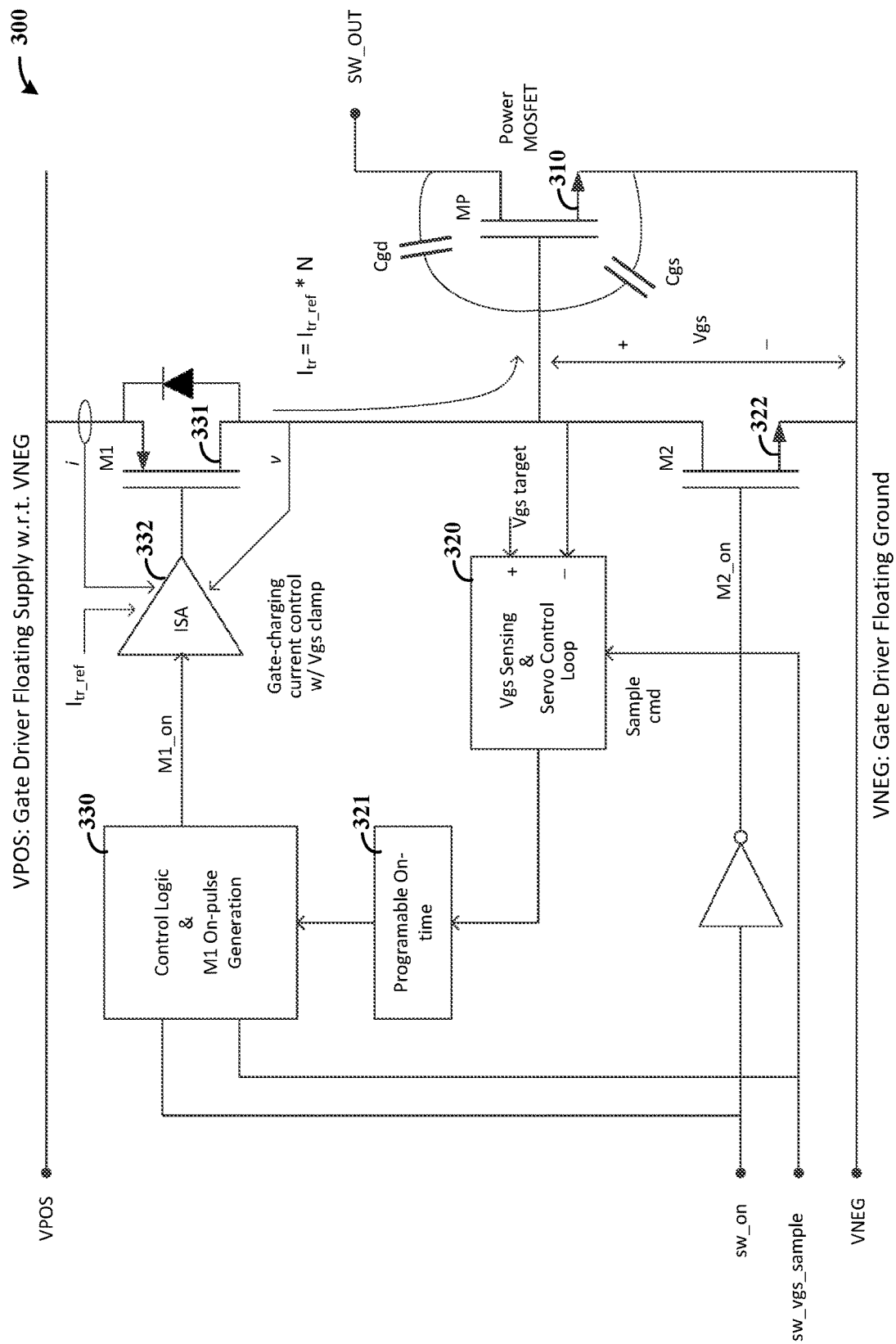
FIG. 3 shows a closed-loop gate driver control circuit, as may be implemented in accordance with one or more aspects of the disclosure.

FIG. 3 shows a closed-loop feedback and Vgs gate driver control circuit 300, as may be implemented with various embodiments. The circuit 300 may, for example, be utilized to provide feedback to the gate driver circuits shown in FIG. 2, with power MOSFET 310 corresponding to one of the power MOSFETs shown therein. A gate-source sensing and servo control loop (feedback) circuit 320 with a programmable on-time 321 operates to controllable pulse circuitry including control logic and pulse generation at 330, for controlling the on-time of a gate pull-up FET 331 such that:

$$Vgs=(Itr*ton)/Cgg,$$

where Cgg is the total effective capacitance associated to a power MOSFET and mainly consists of gate-to-source capacitance Cgs and gate-to-drain capacitance Cgd of the power MOSFET. Since voltage at the drain terminal of the power MOSFET 310 may stop changing as soon as Vgs>Vt (its threshold voltage), Vgs may essentially not change after its gate is floated as it is held constant by Cgg of the power MOSFET.

The Vgs voltage is sampled, as may utilize FET 322 and in response to a sample signal, after a predetermined delay from the on pulse applied to pull-up FET 331 (e.g., after Vgs is stabilized). This sampled voltage is compared with the desired Vgs target at 320, and the Vgs error voltage may be used to adjust ton (on time) to bring the Vgs voltage swing to a target level. Gate charging/current control via a gate/source clamp may be effected via 332.

Figure 4:
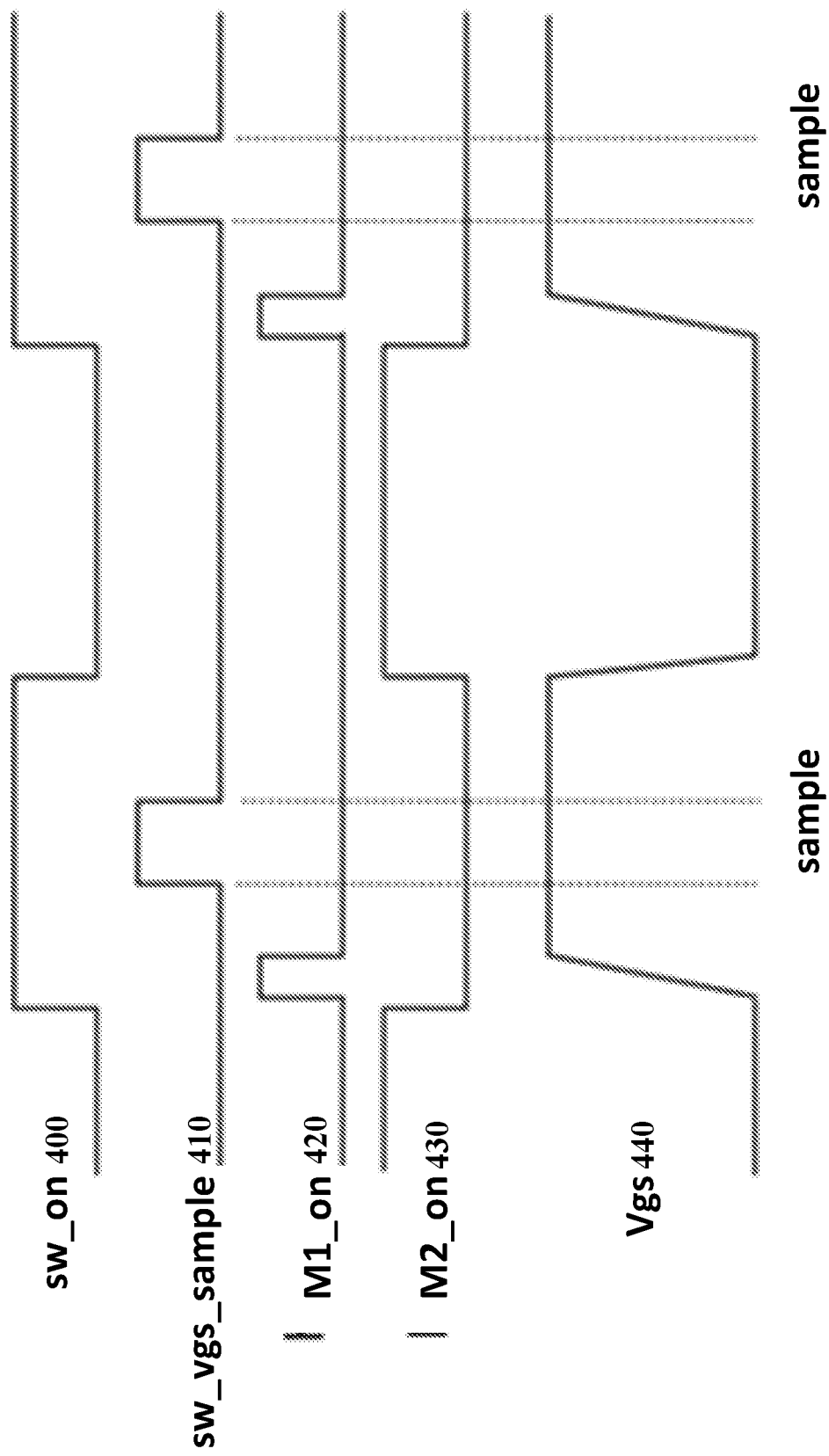
FIG. 4 shows a sampling timing scheme, as may also be implemented in accordance with one or more aspects of the disclosure.

A variety of timing approaches can be used to suit particular embodiments. FIG. 4 shows a Vgs sampling timing scheme, as may be implemented with one or more embodiments herein. Plot 400 represents switching on, as followed by FET 322 (M2 on 430). Plot 410 depicts switching of the sampling of the power MOSFET's gate-source voltage, and plot 420 depicts a corresponding pull-up FET (e.g., M1/331). Plot 440 shows the gate-source voltage (e.g., of power MOSFET 310). As shown, the sampling of the gate-source voltage may be delayed to sometime after initiation of the on switch at 400, to allow the gate-source voltage to stabilize.

Terms to exemplify orientation, such as upper/lower, left/right, top/bottom and above/below, may be depicted or used to refer to relative positions of elements as shown in the figures. It should be understood that the terminology is used for notational convenience only and that in actual use the disclosed structures may be oriented different from the orientation shown in the figures. Thus, the terms or depicted orientations should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, level shifter, driver and/or other circuit-type depictions (e.g., reference numerals 120 and 130 of FIG. 1 may depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1 and 4. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as shown in the figures or described herein is used by the programmable circuit to perform the related steps, functions, operations, activities, etc., such as may relate to applying energy pulses. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with tetras such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, pulse circuitry may operate to obtain feedback from and control a plurality of floating gates. Further, various manners of ramping energy in pulses up or down may be implemented to suit particular control and/or operational needs. Such modifications do not depart from the true spirit and scope of various aspects of the disclosure, including aspects set forth in the claims.

What is claimed is:

1. An apparatus comprising:
    a field effect transistor (FET) having a floating gate and having a target operating voltage above which the FET would be overcharged and around which the FET has a nominal operating range;
    pulse circuitry to apply electric energy to the floating gate in pulses to periodically toggle the FET between an on-state and an off-state, in operation the applied energy being pulsed low relative to the gate's target operating voltage, and then being changed by adjusting successive pulses until the gate reaches the target operating voltage; and
    a feedback circuit to sample a voltage level of, and to enable the pulse circuitry to apply pulsed energy to, the floating gate to control the FET via the floating gate for directing operation of the FET based on the target operating voltage in the nominal operating range.

2. The apparatus of claim 1, wherein the pulse circuitry is configured and arranged with the feedback circuit to adjust the successive pulses by adjusting the duration of an applied energy pulse, relative to a duration of a preceding energy pulse.

3. The apparatus of claim 1, wherein the pulse circuitry is configured and arranged with the feedback circuit to adjust the successive pulses by adjusting a current level of an applied energy pulse, relative to the current level of a preceding energy pulse.

4. The apparatus of claim 1, wherein the pulse circuitry is configured and arranged with the feedback circuit to adjust the successive pulses by adjusting duration and current level of an applied energy pulse, relative to the duration and current level of a preceding energy pulse.

5. The apparatus of claim 1, wherein:
    the pulse circuitry is configured and arranged with the feedback circuit to apply a plurality of energy pulses to the floating gate on a repetitive basis;
    the feedback circuit is configured and arranged to sample a voltage level of the floating gate after each of the plurality of energy pulses is applied; and
    the pulse circuitry is configured and arranged with the feedback circuit to adjust each successive one of the plurality of energy pulses relative to a preceding energy pulse based on the sampled voltage level of the floating gate after application of the preceding energy pulse.

6. The apparatus of claim 1, wherein the pulse circuitry is configured and arranged with the feedback circuit to mitigate overcharging of the floating gate by:
applying iterative energy pulses after applying an initial energy pulse to the floating gate, each iterative energy pulse having an energy level that is higher than the preceding energy pulse, until the floating gate reaches the target operating voltage; and
in response to the sampled voltage level of the floating gate exceeding the target operating voltage after application of a preceding energy pulse, applying a succeeding energy pulse having an energy level that is lower than the energy level of the preceding pulse.

7. The apparatus of claim 1, wherein the pulse circuitry includes a gate driver that applies the pulses to the floating gate, the pulse circuitry being configured and arranged to, after applying energy to the floating gate in pulses, maintain the voltage of the floating gate by setting the driving impedance of the gate driver to high-impedance.

8. The apparatus of claim 1, wherein the feedback circuit is configured and arranged to sample the voltage level at the end of a switch-on transition of the floating gate and after the gate-source voltage of the floating gate has stabilized.

9. The apparatus of claim 1, wherein the pulse circuitry is configured and arranged with the floating gate to float the gate during a switching operation of the FET.

10. The apparatus of claim 9, further including a gate clamp configured and arranged to limit a gate-source voltage of the floating gate.

11. The apparatus of claim 1, wherein the FET is a power MOSFET and the apparatus includes a plurality of the power MOSFETs, pulse circuitry and feedback circuits, further including a switched-capacitor converter coupled to the plurality of power MOSFETs.

12. An apparatus comprising:
a transistor having a gate with a target operating voltage;
a feedback circuit configured and arranged to sample a voltage level of the gate; and
a gate driver circuit configured and arranged with the feedback circuit to charge the gate to the target operating voltage by:
applying an energy pulse to the gate, the energy pulse charging the gate to a voltage level that is less than the target operating voltage of the gate, and
in response to a voltage level of the gate sampled by the feedback circuit, applying an adjusted energy pulse to the transistor gate, the adjusted energy pulse having a value that is based on the sampled voltage level and the target operating voltage of the gate.

13. The apparatus of claim 12, wherein the gate driver circuit is configured and arranged with the feedback circuit to apply the adjusted energy pulse by adjusting one or both of:
a duration of the energy pulse, relative to a duration of a preceding energy pulse applied to the gate; and
a current level of the energy pulse, relative to the current level of a preceding energy pulse applied to the gate.

14. The apparatus of claim 12, wherein:
the gate driver circuit is configured and arranged with the feedback circuit to apply a plurality of energy pulses to the gate on a repetitive basis;
the feedback circuit is configured and arranged to sample a voltage level of the gate after each of the plurality of energy pulses is applied; and
the gate driver circuit is configured and arranged with the feedback circuit to adjust each successive one of the plurality of pulses relative to a preceding pulse based on the sampled voltage level of the gate after application of the preceding pulse to the gate.

15. A method comprising:
applying energy in pulses to a floating gate of a field effect transistor (FET) having a target operating voltage above which the FET would be overcharged and around which the FET has a nominal operating range, by pulsing the applied energy pulsed low relative to the gate's target operating voltage;
sampling a voltage level of the floating gate; and
adjusting energy applied to the floating gate in successive ones of the pulses until the gate reaches the target operating voltage.

16. The method of claim 15, wherein:
applying the energy in pulses includes using pulse circuitry to apply pulsed energy to the floating gate; and
adjusting the energy applied to the floating gate includes enabling the pulse circuitry to apply pulsed energy to the floating gate to control the FET via the floating gate for directing operation of the FET based on the target operating voltage in the nominal operating range.

17. The method of claim 15, wherein adjusting the energy applied to the floating gate in the successive pulses includes adjusting the duration of an applied energy pulse, relative to a duration of a preceding energy pulse.

18. The method of claim 15, wherein adjusting the energy applied to the floating gate in the successive pulses includes adjusting a current level of an applied energy pulse, relative to the current level of a preceding energy pulse.

19. The method of claim 15, wherein adjusting the energy applied to the floating gate in the successive pulses includes adjusting duration and current level of an applied energy pulse, relative to the duration and current level of a preceding energy pulse.

20. The method of claim 15, wherein:
sampling the voltage level of the floating gate includes sampling the voltage level after each of the energy pulses is applied to the floating gate; and
adjusting the energy applied to the floating gate in each of the successive ones of the pulses includes adjusting each successive energy pulse based on the sampled voltage level of the floating gate after application of the preceding energy pulse.

\* \* \* \* \*